(12) United States Patent
Arakane et al.

(10) Patent No.: US 11,462,431 B2
(45) Date of Patent: Oct. 4, 2022

(54) DISCHARGING METHOD AND SUBSTRATE PROCESSING APPARATUS

(71) Applicant: Tokyo Electron Limited, Tokyo (JP)

(72) Inventors: Toshiyuki Arakane, Miyagi (JP); Tetsu Tsunamoto, Miyagi (JP); Yoshinori Osaki, Miyagi (JP); Masanori Sato, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 232 days.

(21) Appl. No.: 16/854,067

(22) Filed: Apr. 21, 2020

(65) Prior Publication Data

US 2020/0343124 A1    Oct. 29, 2020

(30) Foreign Application Priority Data

Apr. 26, 2019  (JP) .............................. JP2019-086407

(51) Int. Cl.
| | | |
|---|---|---|
| H01L 21/683 | (2006.01) | |
| H01L 21/67 | (2006.01) | |
| H01L 21/3065 | (2006.01) | |
| H01L 21/687 | (2006.01) | |
| H01J 37/32 | (2006.01) | |
| C23C 16/458 | (2006.01) | |

(52) U.S. Cl.
CPC ...... *H01L 21/6833* (2013.01); *C23C 16/4586* (2013.01); *H01J 37/32091* (2013.01); *H01J 37/32715* (2013.01); *H01L 21/3065* (2013.01); *H01L 21/67109* (2013.01); *H01L 21/68742* (2013.01)

(58) Field of Classification Search
CPC ............. H01L 21/6833; H01L 21/3065; H01L 21/67109; H01L 21/68742; H01L 21/6875; H01L 21/6831; H01L 22/14; C23C 16/4586; C23C 16/5096; H01J 37/32091; H01J 37/32715; B23Q 3/15; H02N 13/00
USPC ....................................................... 361/234
See application file for complete search history.

(56) References Cited

U.S. PATENT DOCUMENTS 8,111,499 B2 *  2/2012  Ni ....................... H01L 21/6833
                                                        361/234

FOREIGN PATENT DOCUMENTS

JP           2013-149935         8/2013

* cited by examiner

*Primary Examiner* — Dharti H Patel
(74) *Attorney, Agent, or Firm* — IPUSA, PLLC

(57) ABSTRACT

A discharging method of removing electric charge from a substrate is provided. In the discharging method, gas is supplied into a processing chamber while the substrate is placed on an electrostatic chuck provided in the processing chamber, and direct-current (DC) voltage is applied to an attracting electrode of the electrostatic chuck, until discharge occurs in the processing chamber. After the discharge occurs, the DC voltage is adjusted to a magnitude in which an amount of charge on the substrate becomes zero or becomes in a neighborhood of zero, and the substrate is removed from the electrostatic chuck.

12 Claims, 12 Drawing Sheets

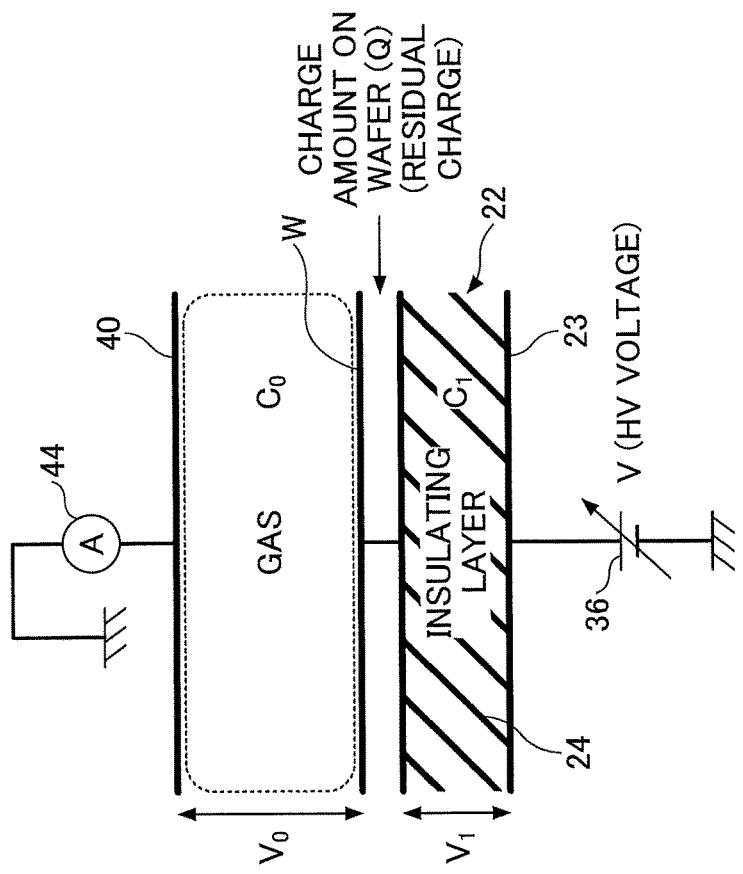
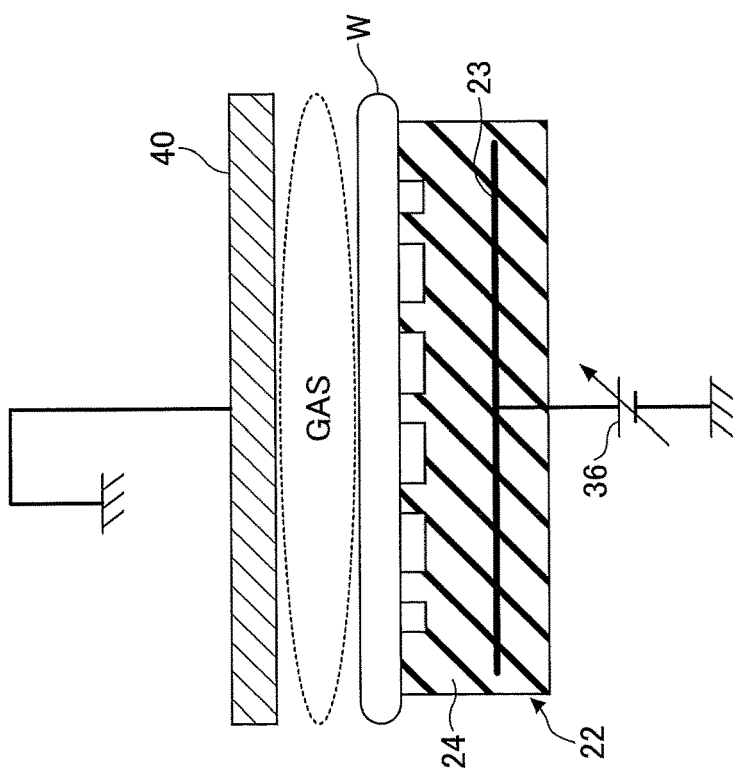

DISCHARGING METHOD AND SUBSTRATE PROCESSING APPARATUS

CROSS-REFERENCE TO RELATED APPLICATIONS

This patent application is based upon and claims priority to Japanese Patent Application No. 2019-086407 filed on Apr. 26, 2019, the entire contents of which are incorporated herein by reference.

TECHNICAL FIELD

The present disclosure relates to a discharging method and a substrate processing apparatus.

BACKGROUND

For example, Patent Document 1 proposes a method of detaching a substrate from an electrostatic chuck. In the method, when the substrate is to be detached from the electrostatic chuck, an amount of charge remained on the surface of the electrostatic chuck and polarity of the charge are estimated based on a monitoring result such as pressure of a heat transfer gas supplied to the lower surface of the substrate, and voltage, required to supply electric charge equal to the estimated amount of charge and having opposite polarity, is applied to a chuck electrode.

However, in the discharging method described in Patent Document 1, a case may occur in which discharging is not sufficient.

CITATION LIST

Patent Document

[Patent Document 1] Japanese Laid-open Patent Application Publication No. 2013-149935

SUMMARY

According to one aspect of the present disclosure, a discharging method of removing electric charge from a substrate is provided. In the discharging method, gas is supplied into a processing chamber while the substrate is placed on an electrostatic chuck provided in the processing chamber, and direct-current (DC) voltage is applied to an attracting electrode of the electrostatic chuck, until discharge occurs in the processing chamber. After the discharge occurs, the DC voltage is adjusted to a magnitude in which an amount of charge on the substrate becomes zero or becomes in a neighborhood of zero, and the substrate is removed from the electrostatic chuck.

BRIEF DESCRIPTION OF THE DRAWINGS

FIG. 2A is a schematic diagram of a structure between a wafer and an upper electrode according to the embodiment;

FIG. 2B is a diagram illustrating an equivalent circuit of the structure between the wafer and the upper electrode according to the embodiment;

DETAILED DESCRIPTION OF EMBODIMENTS

Figure 1:
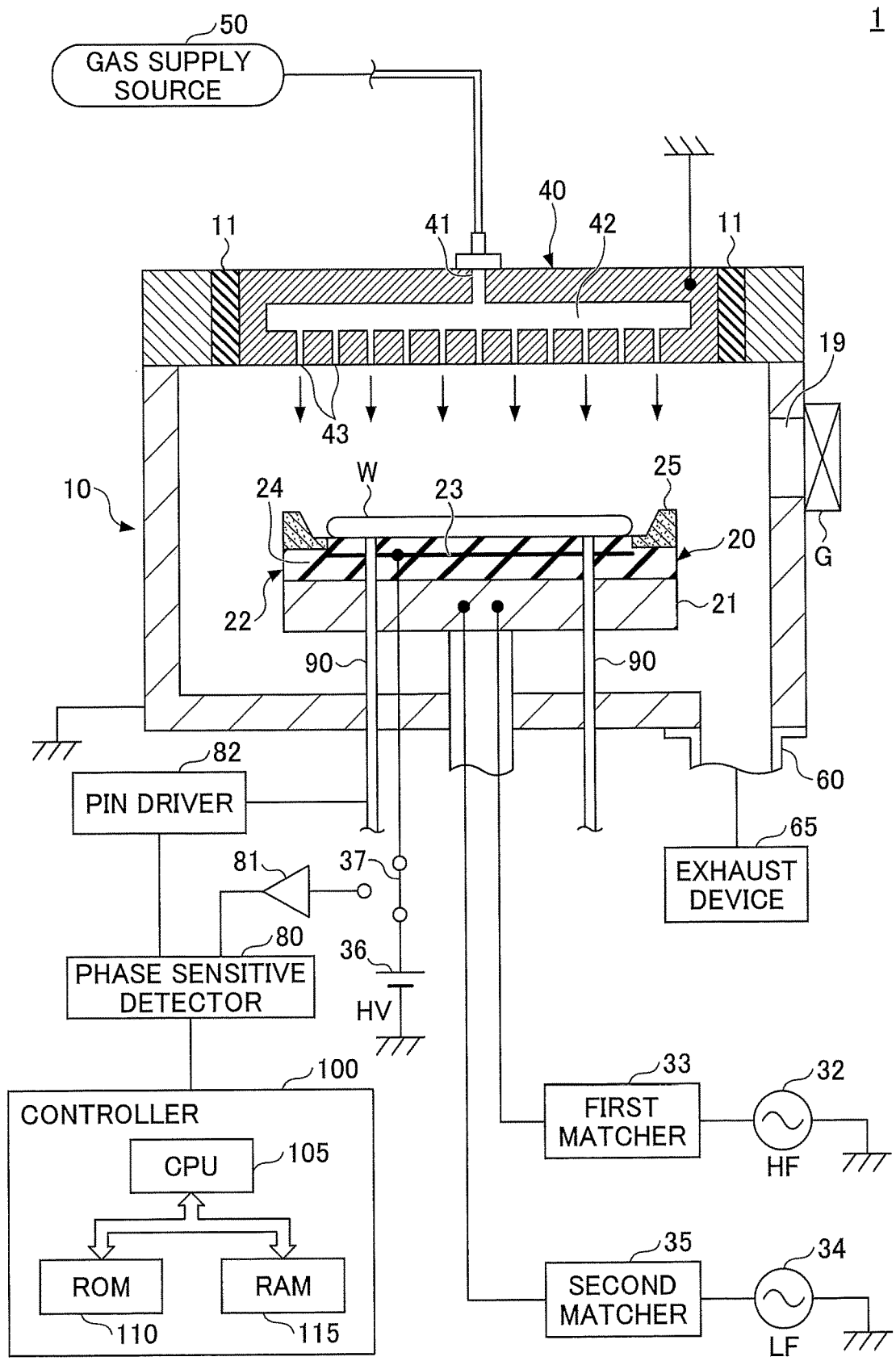
FIG. 1 is a cross-sectional view illustrating an example of substrate processing apparatus according to an embodiment.

Hereinafter, embodiments for carrying out the present disclosure will be described with reference to the drawings. In each drawing, the same components are indicated by the same reference numerals, and overlapping descriptions may be omitted.

<Configuration of Substrate Processing Apparatus>

First, an example of a configuration of the substrate processing apparatus 1 will be described with reference to FIG. 1. FIG. 1 is a cross-sectional diagram illustrating an example of the substrate processing apparatus 1 according to the present embodiment. The substrate processing apparatus 1 according to the present embodiment is a capacitively coupled parallel plate substrate processing apparatus, and includes a generally cylindrical processing chamber 10. To the inner surface of the processing chamber 10, anodic oxidation treatment is applied. An inside of the processing chamber 10 is a process chamber in which a plasma process, such as an etching process or a deposition process, is performed by a plasma.

On a stage 20, a wafer W, which is an example of a substrate, is placed. The stage 20 is formed from, for example, aluminum (Al), titanium (Ti), silicon carbide (SiC), or the like. The stage 20 also functions as a lower electrode.

On an upper side of the stage 20, an electrostatic chuck 22 that attracts the wafer W electrostatically is provided. The electrostatic chuck 22 is configured such that an attracting electrode 23 is embedded in a dielectric base member 24. A power supply 36 is connected to the attracting electrode 23 via a switch 37. When direct-current (DC) voltage is applied from the power supply 36 to the attracting electrode 23 (hereinafter the voltage applied to the attracting electrode 23 is referred to as "HV voltage"), the wafer W is attracted to the electrostatic chuck 22 by Coulomb force.

An annular edge ring 25 (also referred to as a focus ring) is disposed at an outer periphery of an upper surface of the electrostatic chuck 22, so as to surround an outer periphery of the wafer W. The edge ring 25 is formed of silicon for example, and functions to cause a plasma to converge toward a surface of the wafer W, in order to improve efficiency of a plasma process.

The stage 20 is supported by a support 21, and thereby the stage 20 is held at the bottom of the processing chamber 10. A coolant passage may be formed within the support 21. Also, a heat transmitting gas may be supplied to a lower surface of the wafer W. Temperature of the wafer W is controlled by circulating the coolant in the coolant passage and by supplying the heat transmitting gas to the lower surface of the wafer W.

Radio frequency electric power HF for plasma generation at a predetermined frequency is applied to the stage 20 from a first radio frequency power supply 32. Also, from a second radio frequency power supply 34, radio frequency electric power LF for generating bias voltage is applied to the stage 20. A frequency of the radio frequency electric power LF is lower than the frequency of the radio frequency electric power HF for plasma generation. The first radio frequency power supply 32 is electrically connected to the stage 20 via a first matcher 33. The second radio frequency power supply 34 is electrically connected to the stage 20 via a second matcher 35. The first radio frequency power supply 32 applies, for example, 100 MHz of radio frequency electric power HF to the stage 20. The second radio frequency power supply 34 applies, for example, 13.56 MHz of radio frequency electric power LF to the stage 20.

The first matcher 33 causes internal impedance (or output impedance) of the first radio frequency power supply 32 to match impedance of a load. The second matcher 35 causes internal impedance (or output impedance) of the second radio frequency power supply 34 to match impedance of the load. In the present embodiment, the first radio frequency electric power is applied to the stage 20, but the first radio frequency electric power may be applied to a gas showerhead 40.

The gas showerhead 40 is attached to an opening of a ceiling of the processing chamber 10 via a shield ring 11 covering an outer edge of the gas showerhead 40, such that the gas showerhead 40 occludes the opening. The gas showerhead 40 is grounded. The gas showerhead 40 may be formed of silicon. The gas showerhead 40 also functions as a counter electrode (upper electrode) facing the stage 20 (lower electrode).

A gas inlet 41 for introducing gas is formed at the gas showerhead 40. Inside the gas showerhead 40 is a diffusion chamber 42 for diffusing gas. A gas output from a gas supply source 50 is supplied to the diffusion chamber 42 via the gas inlet 41, and diffuses in the diffusion chamber 42. The gas diffused in the diffusion chamber 42 is introduced to the interior of the processing chamber 10 from a large number of gas supply holes 43.

An exhaust port 60 is formed at the bottom surface of the processing chamber 10, and the interior of the processing chamber 10 is evacuated by an exhaust device 65 connected to the exhaust port 60. This allows the processing chamber 10 to be maintained in a predetermined quality of vacuum. A gate valve G is provided at a side wall of the processing chamber 10. The gate valve G is opened and closed when the wafer W is loaded into the processing chamber 10 or when the wafer W is unloaded from the processing chamber 10.

The substrate processing apparatus 1 is provided with a controller 100 that controls an entire operation of the substrate processing apparatus 1. The controller 100 includes a CPU (Central Processing Unit) 105, a ROM (Read Only Memory) 110, and a RAM (Random Access Memory) 115. By the CPU 105 executing a program stored in the RAM 115 or the ROM 110, the controller 100 controls various components in the substrate processing apparatus 1. The CPU 105 performs desired processing such as etching, in accordance with a recipe stored in a memory region such as the RAM 115. The recipe describes control information of the substrate processing apparatus 1 corresponding to a process condition, such as process time, pressure (gas exhaust), radio frequency electric power, voltage, various gas flow rates, temperatures in the processing chamber (upper electrode temperature, side wall temperature of the processing chamber, temperature of a wafer W, electrostatic chuck temperature, etc.), and a refrigerant temperature. The program and the recipe representing the process condition may be stored in a hard disk drive or a semiconductor memory. The recipe may also be stored in a computer-readable removable recording medium such as a CD-ROM or a DVD, and the removable recording medium may be loaded in a predetermined location in an accessible state.

When loading or unloading a wafer W, the opening and closing of the gate valve G is controlled. When the wafer W is loaded into the processing chamber 10 from an inlet/outlet port 19, the wafer W is passed from an arm to pusher pins 90. Three pusher pins 90 are provided for example (only two pusher pins 90 are illustrated in FIG. 1). The pusher pins 90 are provided so as to penetrate the stage 20, and support the wafer W.

The pusher pins 90 are lifted and lowered by actuation of a pin driver 82. When the pusher pins 90 are lowered and the wafer W is placed on the stage 20, HV voltage is applied from the power supply 36 to the attracting electrode 23, and the wafer W is attracted and held by the electrostatic chuck 22.

A process gas is supplied from the gas supply source 50 into the processing chamber 10. The first radio frequency electric power is applied from the first radio frequency power supply 32 to the stage 20, and the second radio frequency electric power is applied from the second radio frequency power supply 34 to the stage 20. This causes the wafer W to be subjected to a predetermined plasma process due to action of a plasma generated above the wafer W and the attraction of ions.

After the plasma process, HV voltage of a predetermined magnitude is applied from the power supply 36 to the attracting electrode 23, to remove electric charge from the wafer W. The wafer W is released from the electrostatic chuck 22, and is unloaded from the gate valve G to the outside of the processing chamber 10. Loading, plasma processing, and unloading of the next wafer W are also carried out in a similar manner.

<Electric Discharge Between Wafer and Upper>Electrode

Electric discharge between the wafer W and the upper electrode will be described with reference to FIGS. 2A and 2B. FIG. 2A is a schematic diagram illustrating a structure between the wafer and the upper electrode, and FIG. 2B illustrates an equivalent circuit of the structure between the wafer and the upper electrode.

When a surface layer of the electrostatic chuck 22 changes in quality by a plasma or the like, electric charge (residual charge) is gradually accumulated on the surface of the electrostatic chuck 22, and the wafer W is charged accordingly (charge amount Q of the wafer in FIG. 2B). Because of the residual charge on the surface of the electrostatic chuck 22, attracting force is generated (remains) on the wafer W. The attracting force generated because of the residual charge on the surface of the electrostatic chuck 22 may also be referred to as "residual attracting force". If the residual charge on the wafer W is not removed sufficiently when the wafer W is dechucked, the pusher pins 90 cause damage, such as a crack, to the wafer W.

Therefore, in the present embodiment, a step of cancelling the residual charge on the surface of the electrostatic chuck 22 is performed, by adjusting the charge amount of the wafer W along with removal of charge on the wafer W. Hereinafter, this step may be referred to as a "dechuck step". This avoids damaging the wafer W when removing the wafer W from the electrostatic chuck.

Specifically, in the dechuck step, as illustrated in FIG. 2A, a space between the wafer W and the upper electrode (gas showerhead 40) is filled with gas first. When HV voltage is applied from the power supply 36 to the attracting electrode 23 while the space is filled with gas, a potential difference occurs between the wafer W and the upper electrode because electric potential of the upper electrode is fixed (grounded). As magnitude of the HV voltage applied to the attracting electrode 23 is increased, a glow discharge occurs when the potential difference exceeds a given threshold. The given threshold varies based on pressure in the processing chamber 10, according to Paschen's law. When the glow discharge occurs, electrons move from the upper electrode to the wafer W. Thus, by controlling the HV voltage after the glow discharge is started, supplying electric charge to the wafer W and/or removal of electric charge from the wafer W can be continuously controlled. This allows adjustment of an amount of charge on the wafer W, and the residual charge on the surface of the electrostatic chuck 22 can be canceled.

As illustrated in the equivalent circuit of FIG. 2B, the HV voltage applied from the power supply 36 to the attracting electrode 23 is denoted by V. The potential difference between the wafer W and the upper electrode (ground) is referred to as "wafer potential" and is denoted by $V_0$. A potential difference between the wafer W and the attracting electrode 23 is denoted by $V_1$.

A charge amount on the wafer is denoted by Q. Note that, in the following description, the charge amount on the wafer may also be referred to as a "wafer charge amount". Capacitance of the electrostatic chuck 22 (e.g. capacitance of a region of an insulating layer between the wafer W and the attracting electrode 23) is denoted by $C_1$, and capacitance of the space between the wafer and the upper electrode that is filled with gas is denoted by $C_0$. Voltage between the wafer W and the upper electrode, at which discharge starts to occur, is referred to as "discharging start voltage", and is denoted by $V_{th}$.

A relationship between the HV voltage V, $V_0$, and $V_1$ can be expressed by the following equations (a) and (b).

$$V = V_0 + V_1 \quad \text{(a)}$$

$$Q = C_0 V_0 - C_1 V_1 \quad \text{(b)}$$

From (a) and (b), the following equation (c) is derived.

$$V_0 = (C_1 V - Q)/(C_0 + C_1) \quad \text{(c)}$$

According to the equation (c), as the HV voltage V is increased, the wafer potential $V_0$ increases, and as the HV voltage V is decreased, the wafer potential $V_0$ decreases. However, when the wafer potential $V_0$ reaches the discharging start voltage, discharge occurs between the wafer W and the upper electrode, and movement of electrons between the wafer W and the upper electrode is started. As the HV voltage is increased thereafter, charge amount Q on the wafer increases. Accordingly, electric charge can be supplied to the wafer W.

<Adjustment of Wafer Charge Amount in the Absence of Residual Charge>

Figure 3A:
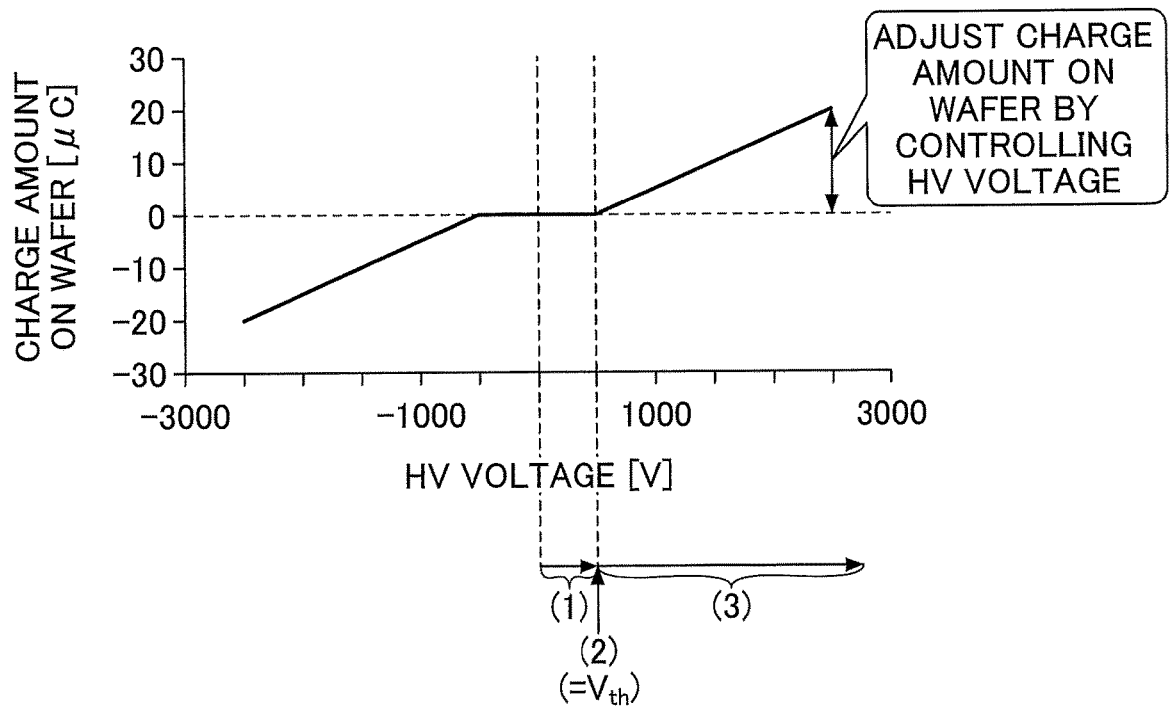
FIGS. 3A and 3B are diagrams illustrating an example of a relationship between HV voltage and a charge amount on the wafer.
Figure 3B:
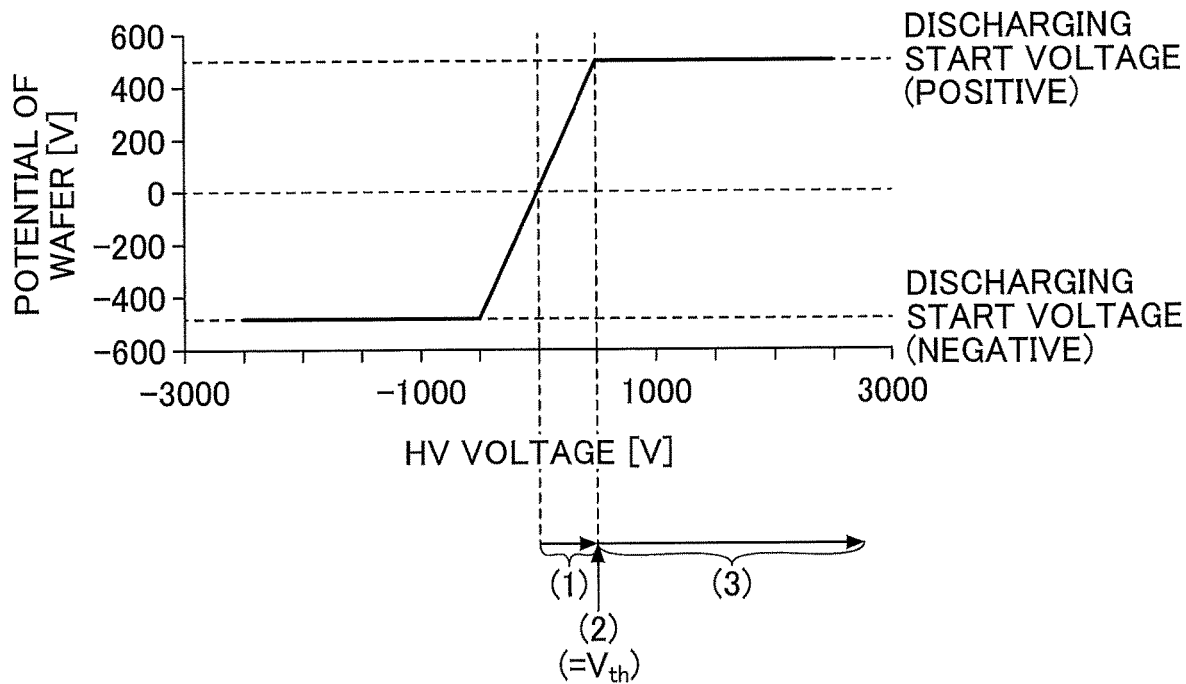

The adjustment of the wafer charge amount when there is no residual charge in the electrostatic chuck 22 will be described with reference to FIGS. 3A and 3B. FIGS. 3A and 3B are diagrams illustrating an example of a relationship between the HV voltage and the wafer charge amount. FIG. 3A illustrates a relationship between the wafer charge amount and the HV voltage supplied from the power supply 36, and FIG. 3B illustrates a relationship between the wafer potential and the HV voltage.

In a case in which no residual charge is present in the electrostatic chuck 22, as the HV voltage is increased from a state in which the wafer charge amount is "0" (a point in which the HV voltage is 0), as indicated by an arrow (1) at the bottom of FIG. 3B, the wafer potential monotonically increases as illustrated in FIG. 3B. Thereafter, as the wafer potential reaches the discharging start voltage ($V_{th}$), which is a location indicated by an arrow (2) illustrated in FIG. 3B, discharge is started, and increase in the wafer potential stops.

When the discharge occurs, the wafer potential becomes constant at the discharging start voltage Vth, and the wafer W is charged or discharged depending on magnitude of the HV voltage. As illustrated in a section (3) of FIGS. 3A and 3B, by controlling the HV voltage to an appropriate value, the wafer charge amount can be continuously adjusted in accordance with the HV voltage, as illustrated in FIG. 3A. Also, in a case in which the wafer charge amount is negative, the wafer charge amount can be continuously adjusted in accordance with the HV voltage.

<Adjustment of Wafer Charge Amount When Residual Charge is Present>

Figure 4A:
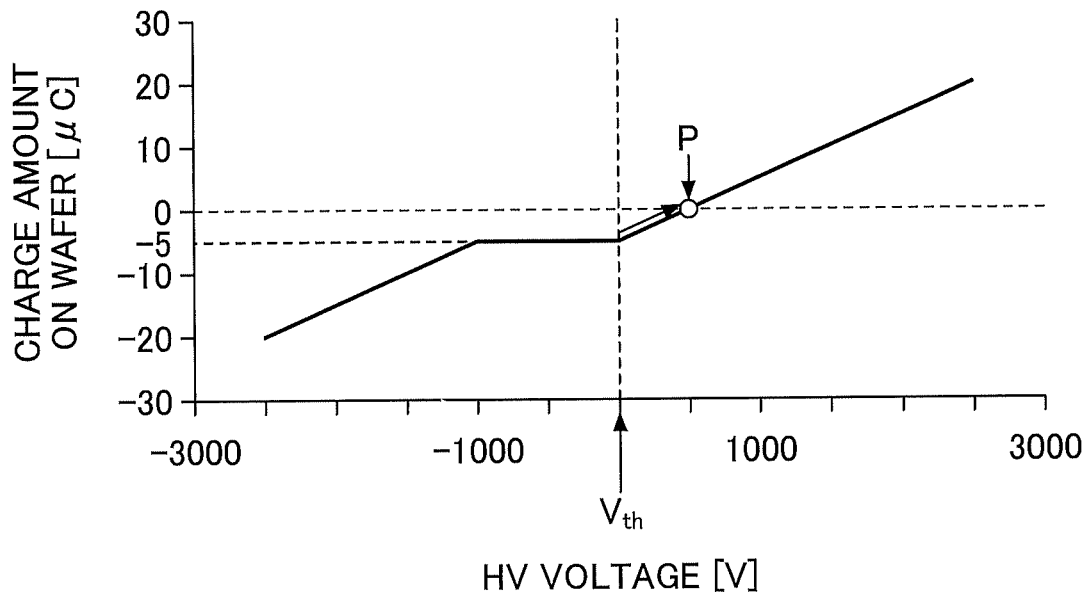
FIG. 4A to 4D are diagrams illustrating an outline of controlling the charge amount on the wafer.
Figure 4B:
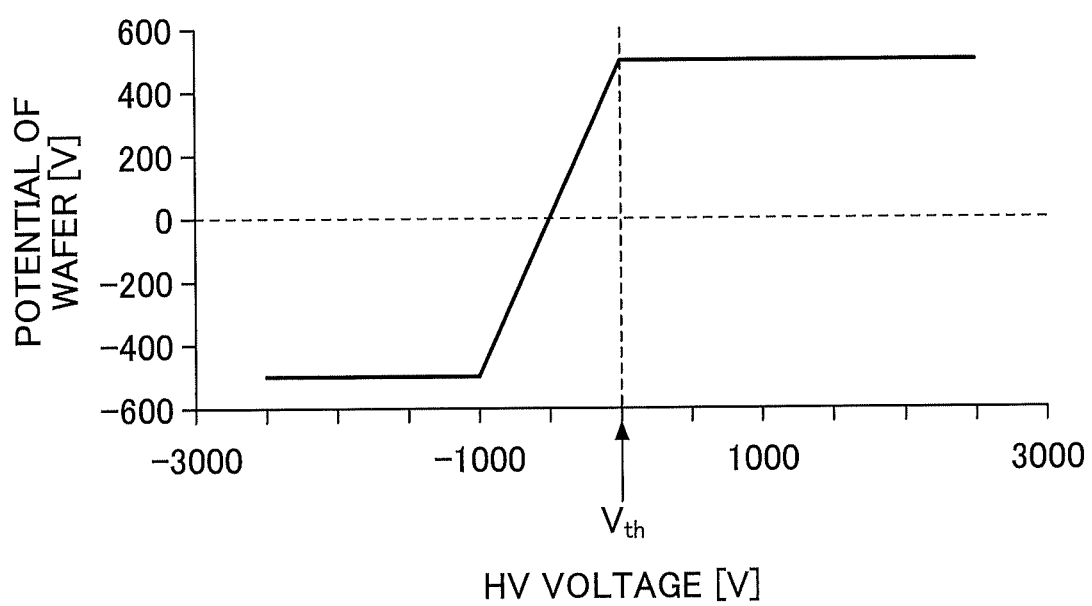
Figure 4C:
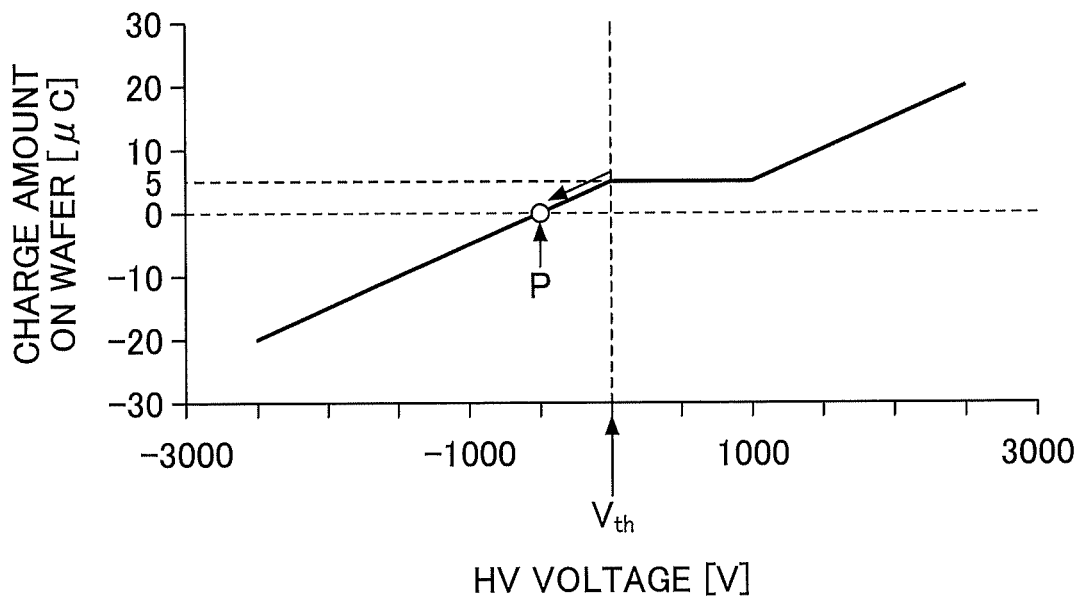
Figure 4D:
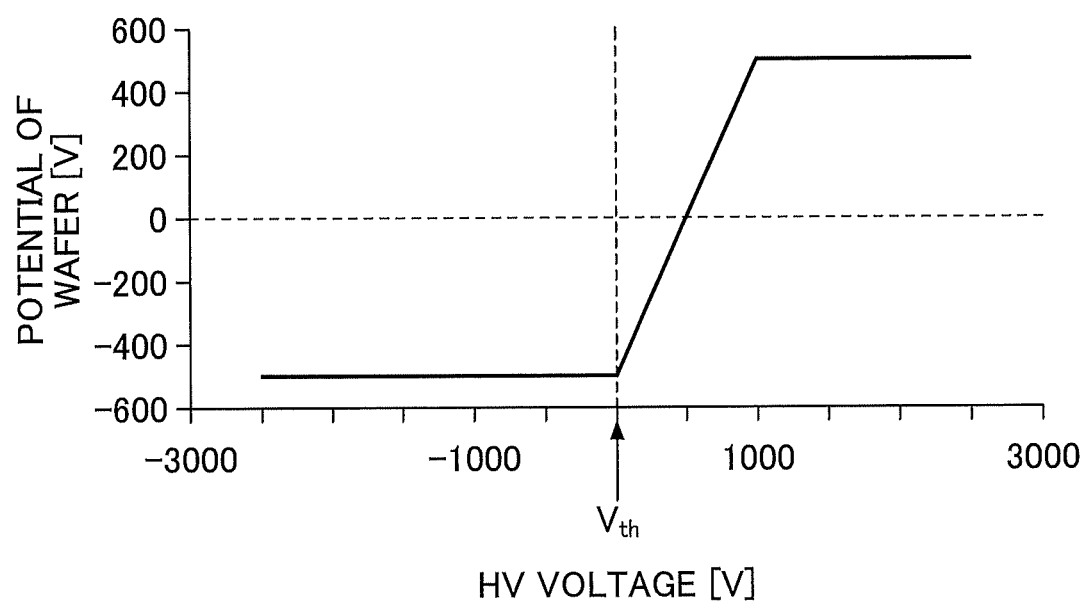

Next, an outline of controlling the wafer charge amount when residual charge is present in the electrostatic chuck 22 will be described with reference to FIGS. 4A to 4D. FIGS. 4A and 4B illustrate relationships between the wafer charge amount and the HV voltage and between the wafer potential and the HV voltage in a case in which the wafer W is negatively charged (−5 μC) due to residual charge present in the electrostatic chuck 22. FIGS. 4C and 4D illustrate relationships between the wafer charge and the HV voltage and between the wafer potential and the HV voltage in a case in which the wafer W is positively charged (5 μC) due to residual charge present in the electrostatic chuck 22.

In a case in which the wafer W is negatively charged (−5 μC), as the HV voltage is controlled in a positive direction from the discharging start voltage $V_{th}$ at which a glow discharge begins to occur, as indicated by an arrow illustrated in FIG. 4A, a state of the wafer reaches a charge neutralization point P. Note that the "HV voltage is controlled in the positive direction" means that a voltage of positive polarity is applied as the HV voltage or the magnitude of the HV voltage is (gradually) increased. Conversely, "HV voltage is controlled in the negative direction" means that a voltage of negative polarity is applied as the HV voltage or the magnitude of the HV voltage is (gradually) decreased. Also, "charge neutralization point" means a state at which the charge amount on the wafer is zero, i.e., a state at which an amount of the residual charge on the electrostatic chuck 22 becomes zero, as a result of controlling the HV voltage to charge and/or discharge the wafer.

In a case in which residual attracting force occurs on the wafer W, electric charge remains on the surface of the electrostatic chuck 22. As a result, the wafer W on the electrostatic chuck 22 has electric charge of opposite polarity with respect to the residual charge on the electrostatic chuck 22. In the present embodiment, by controlling the HV voltage, the charge amount on the wafer is adjusted to zero.

If the charge amount on the wafer W is negative, the HV voltage is controlled in a positive direction. For example, because FIGS. 4A and 4B illustrate a case in which the wafer W is charged to −5 μC, the HV voltage is controlled in a positive direction in the case of FIGS. 4A and 4B. Then electrons are emitted from the upper electrode to the wafer W. When the HV voltage of approximately 700 V is applied to the attracting electrode 23, the charge amount on the wafer W becomes zero, and the electrostatic chuck 22 becomes in a state in which the residual charge is eliminated.

Conversely, if the charge amount on the wafer W is positive, the HV voltage is controlled in a negative direction. For example, because FIGS. 4C and 4D illustrate a case in which the wafer W is charged to 5 μC, the HV voltage is controlled in a negative direction. Then electrons are supplied from the wafer W to the upper electrode. When the HV voltage of approximately −700 V is applied to the attracting electrode 23, the charge amount on the wafer W becomes zero and the electrostatic chuck 22 becomes in a state in which the residual charge is eliminated.

As described above, by gradually changing the HV voltage V to a positive or negative direction, the wafer can reach the charge neutralization point. By adjusting the wafer charge amount based on control of the HV voltage, occurrence of residual attracting force in the wafer W can be avoided. Note that FIGS. 4A to 4D illustrate results of simulation by setting the capacitance $C_0$ of the space between the wafer W and the upper electrode to 100 [pF], by setting the capacitance $C_1$ of the electrostatic chuck 22 to 10 [nF], and by setting the discharging start voltage $V_{th}$ to 500 [V] as an example.

Figure 5:
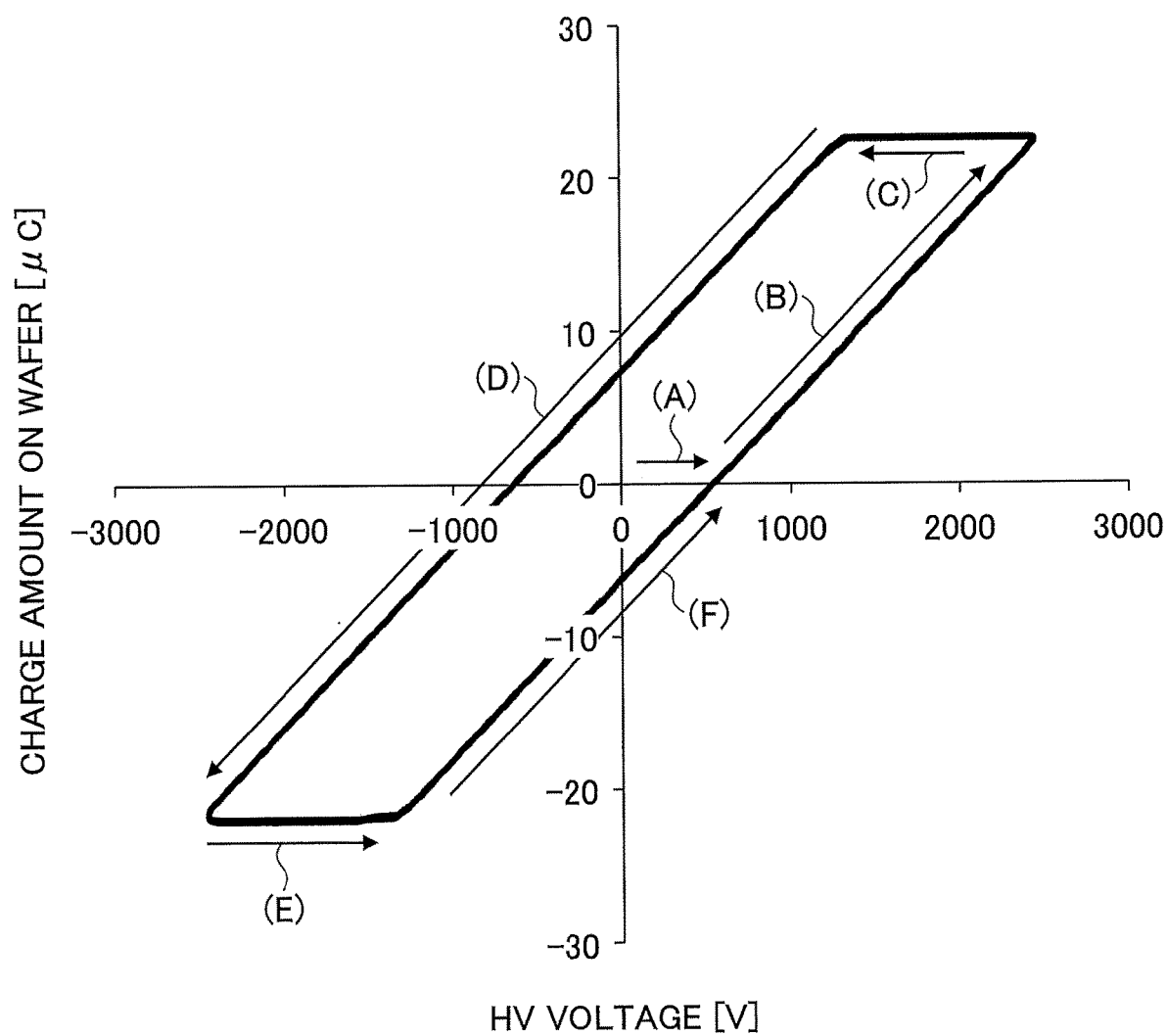
FIG. 5 is a diagram illustrating an example of how the charge amount of the wafer changes in accordance with change in the HV voltage.

FIG. 5 is a diagram illustrating how the wafer charge amount changes when the HV voltage V is gradually controlled from zero to a positive direction, from a positive value to a negative direction, and from a negative value to a positive direction.

In a section indicated by an arrow (A), the HV voltage is controlled to a positive direction (e.g. the HV voltage is increased) from a state in which the wafer charge amount is zero.

In a section indicated by an arrow (B), the wafer potential reaches the positive discharging start voltage $V_{th}$, and discharge is started. When discharge is started, the wafer charge amount (negative charge amount) increases because negative charge (electrons) is moved from the upper electrode to the wafer W.

In a section indicated by an arrow (C), the HV voltage V is decreased. When the HV voltage V is decreased, the wafer potential also decreases. Thus, discharge does not occur.

In a section indicated by an arrow (D), the wafer potential reaches the negative discharging start voltage $-V_{th}$, and discharge is started. When discharge is started, the negative charge (electrons) is supplied from the wafer to the upper electrode.

In a section indicated by an arrow (E), the HV voltage V is increased. As the HV voltage V is increased, the wafer potential also increases. Thus, discharge does not occur.

In a section indicated by an arrow (F), the wafer potential reaches the positive discharging start voltage $V_{th}$, and discharge is started. When discharge is started, negative charge (electrons) is moved from the upper electrode to the wafer W.

<Discharging Start Voltage>

Figure 6:
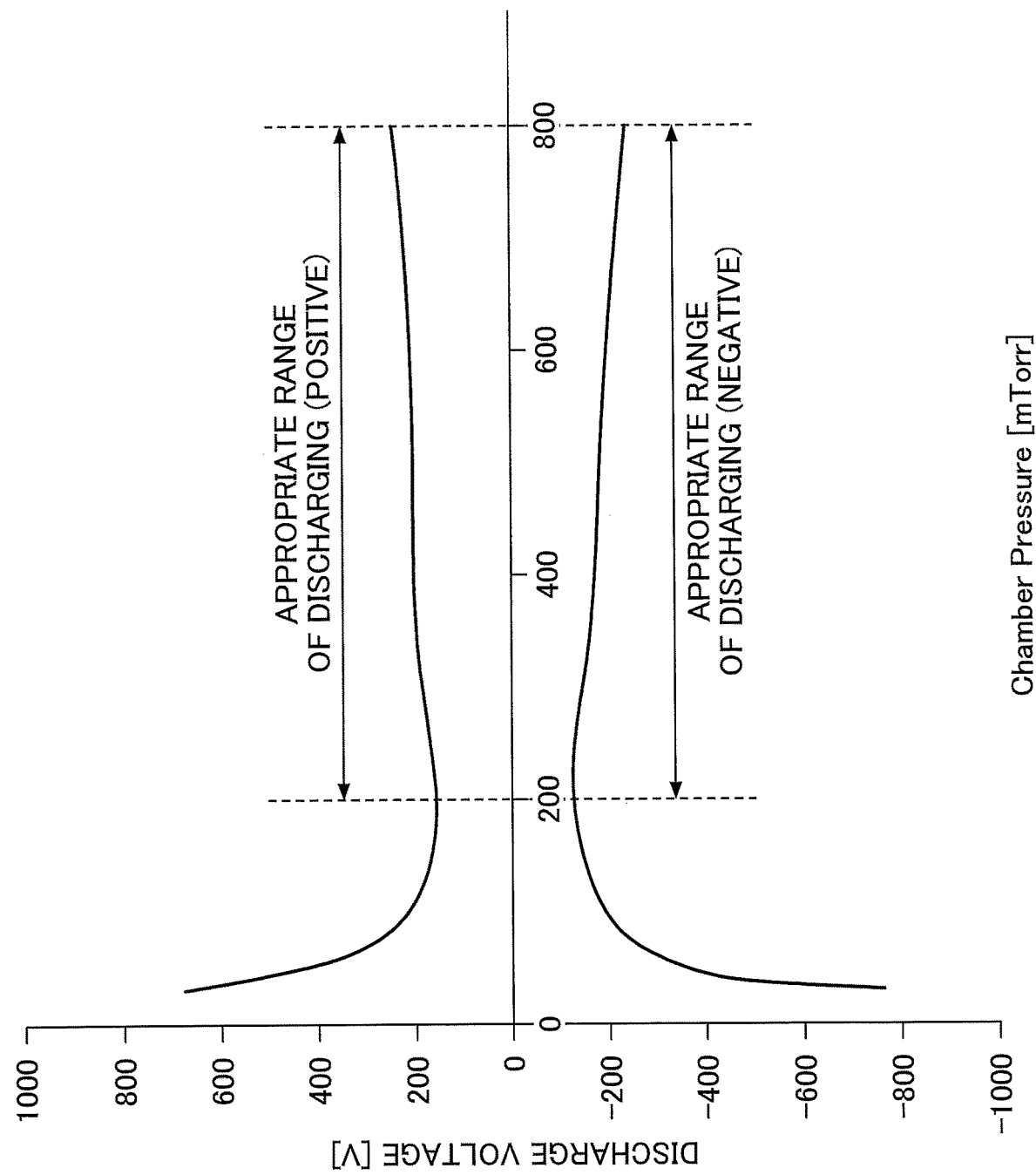
FIG. 6 is a diagram illustrating an example of a relationship between discharge voltage and pressure in a processing chamber according to the embodiment.

Next, the discharging start voltage $V_{th}$ will be described with reference to FIG. 6. FIG. 6 is a diagram illustrating an example of a discharge voltage with respect to the pressure in the processing chamber 10 according to the present embodiment. FIG. 6 illustrates an example of an experimental result for obtaining, in advance, an appropriate value of the "discharging start voltage $V_{th}$" that is used to control the HV voltage. The horizontal axis of FIG. 6 indicates the pressure in the processing chamber 10 and the vertical axis indicates the discharge voltage. From the result of the experiment of FIG. 6, it can be estimated how much the pressure in the processing chamber 10 should be controlled by supplying gas into the processing chamber 10, in order that discharge easily occurs. That is, it can be estimated how much the discharging start voltage can be reduced in accordance with Paschen's law. According to the result of this experiment, it was found that both the positive discharge voltage and the negative discharge voltages become low when the pressure is in a range of 200 to 800 mTorr. Thus, it was found that the discharging start voltage $V_{th}$ can be reduced and adjustment of the wafer charge amount is facilitated, by supplying gas such that the pressure in the processing chamber 10 is in the range of 200 to 800 mTorr.

<Discharge/Dechuck Step>

Figure 7:
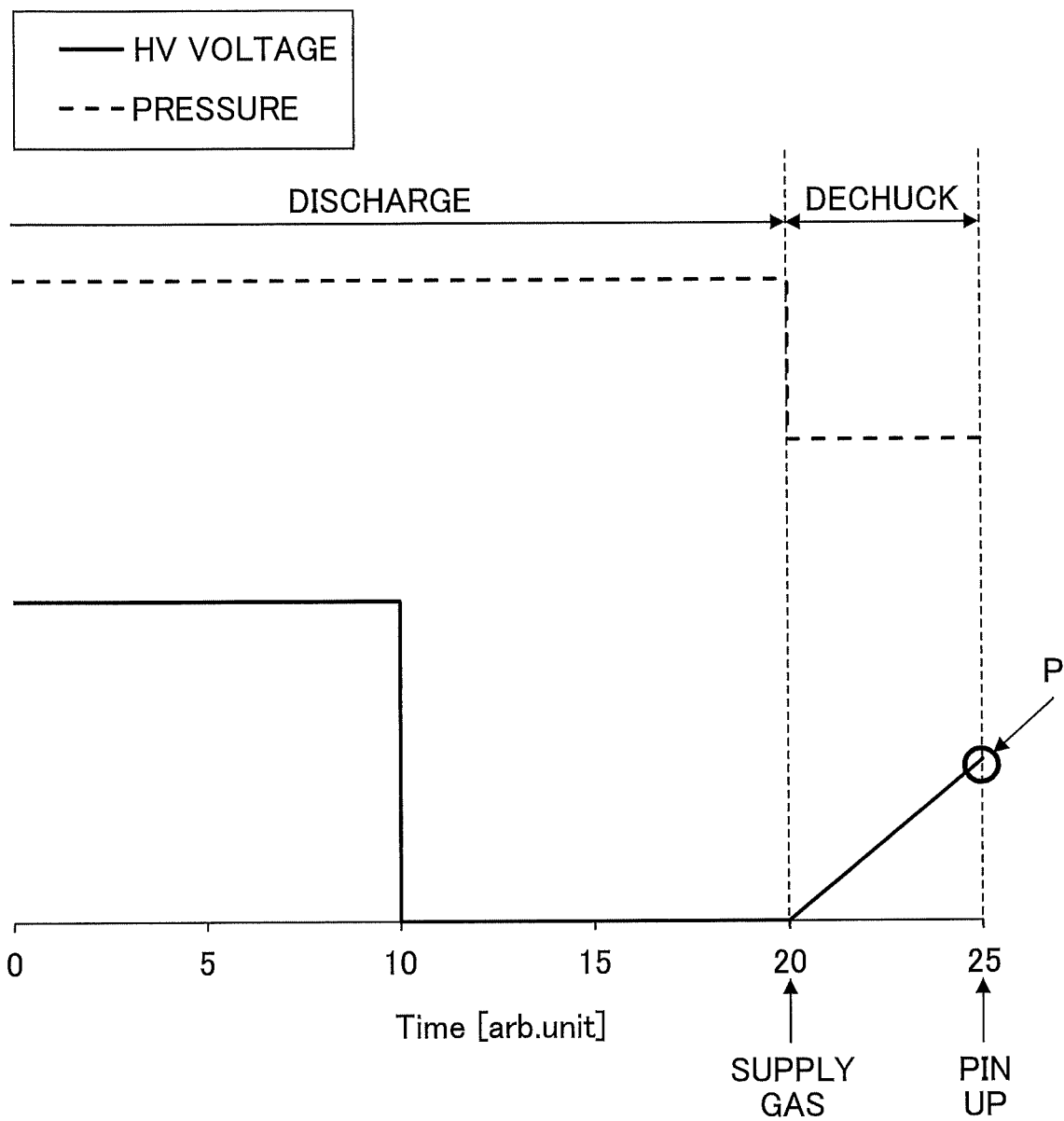
FIG. 7 is a timing chart illustrating an example of a discharge and dechuck step according to the embodiment.
Figure 8:
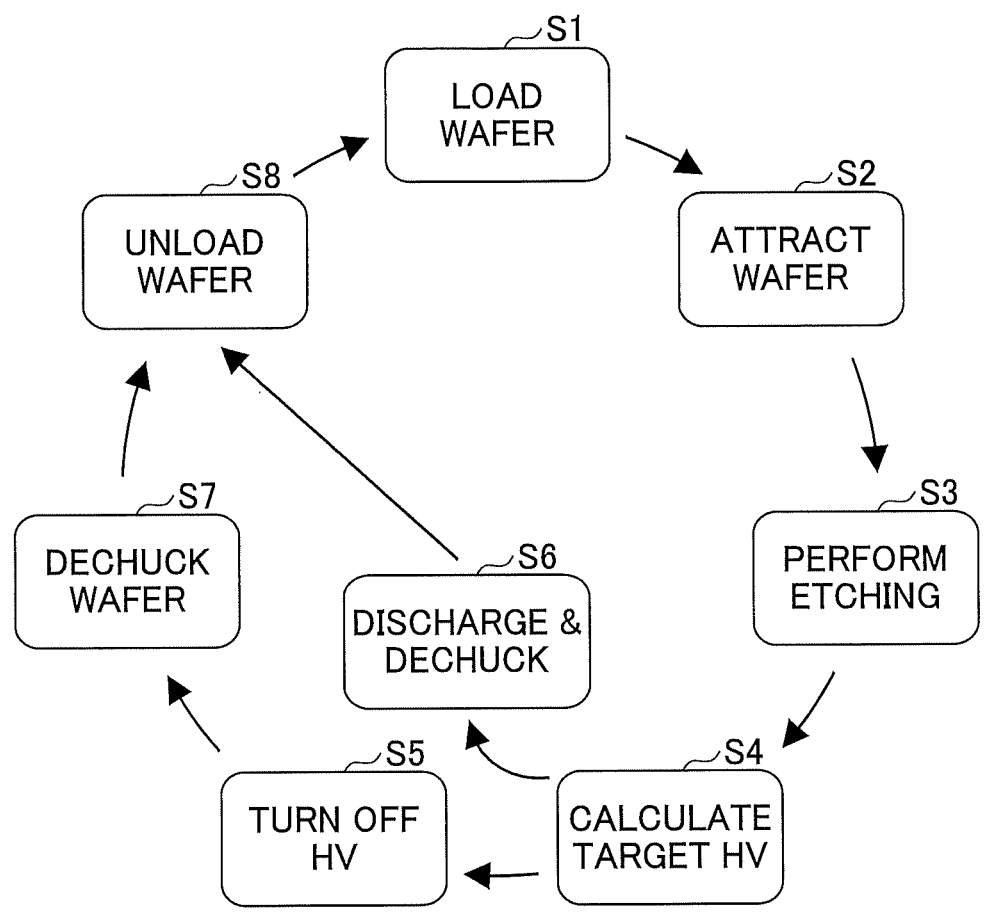
FIG. 8 is a diagram illustrating an example of an execution cycle of the discharge and dechuck step according to an embodiment.

The discharging method according to the present embodiment includes a dechuck step that adjusts the wafer charge amount by controlling the HV voltage as described above. An outline of the discharging method according to the present embodiment will be described with reference to FIGS. 7 and 8. FIG. 7 is a timing chart illustrating an example of the discharge and dechuck step according to the present embodiment. FIG. 8 is a diagram illustrating an example of an execution cycle of wafer processing including the discharge and dechuck step according to the present embodiment.

As illustrated in FIG. 7, the discharge and dechuck step is performed after the wafer processing and just before lifting the pusher pins 90 to dechuck the wafer W from the electrostatic chuck 22. As illustrated in FIG. 7, in a discharge procedure, application of the HV voltage is stopped to release electrostatic attraction of the electrostatic chuck 22 to the wafer W. Note that, in the discharge procedure, after stopping the application of the HV voltage, HV voltage whose magnitude is the same as the HV voltage applied during processing of the wafer W and whose polarity is reversed may be applied while an inert gas is supplied into the processing chamber 10.

Thereafter, at a time of starting a dechuck procedure, a predetermined gas (such as an inert gas) is supplied into the processing chamber 10 such that the pressure in the processing chamber 10 becomes in the range of 200 to 800 mTorr. This allows the discharging start voltage $V_{th}$ to be an appropriate value when controlling the HV voltage.

Even after the application of the HV voltage is stopped, residual attracting force may be generated on the wafer W because the wafer W is positively or negatively charged by residual charge on the surface of the electrostatic chuck 22. Thus, in the discharge and dechuck step according to the present embodiment, residual attracting force is removed from the wafer W by adjusting the HV voltage to remove the wafer charge amount. A relationship between the HV voltage, the discharging start voltage $V_{th}$, the wafer charge amount Q, and the capacitance ($C_0$ and $C_1$) are expressed by the following equation (d). Note that, in the following equations (d) and (e), the HV voltage is denoted by "V".

$$Q = C_1 V - (C_0 + C_1) V_{th} \qquad (d)$$

The equation (d) can be rewritten as the following equation (e).

$$V = \frac{Q + (C_0 + C_1) V_{th}}{C_1} \qquad (e)$$

As illustrated in FIG. 4, in a case in which the wafer W is negatively charged, the wafer reaches the charge neutralization point P if the HV voltage is controlled to the positive direction. If the wafer W is positively charged, the wafer W reaches the charge neutralization point P by controlling the HV voltage in the negative direction. At the charge neutralization point P, the residual charge on the surface of the electrostatic chuck 22 is canceled and the wafer charge amount becomes zero. By controlling the HV voltage so that the state of the wafer W becomes the charge neutralization point P, damaging the wafer W can be avoided when the wafer W is dechucked.

In the discharge and dechuck step, the HV voltage is adjusted such that the wafer W reaches the charge neutralization point P. However, a control method of the HV voltage is not limited to the above-mentioned method. For example, the HV voltage of a certain value or a certain range, in which the charge amount on the wafer W becomes zero or becomes in a neighborhood of zero, may be applied. In applying the HV voltage, the HV voltage may be applied such that an absolute value of the HV voltage is gradually increased. In a case in which the HV voltage to be applied is positive, magnitude, of the HV voltage may be gradually increased. Conversely, in a case in which the HV voltage to be applied is negative, magnitude of the HV voltage may be gradually decreased. Note that, in the present disclosure, magnitude (a certain value or a certain range) of the HV voltage in which the charge amount on the wafer W becomes zero or becomes in a neighborhood of zero may be referred to as a "charge neutralization region". The charge neutralization region may be within a predetermined range from voltage (HV voltage) at the charge neutralization point P.

For example, if the capacitance $C_1$ of the region between the attracting electrode 23 and the wafer W is 10 [nF], the charge neutralization region may be within ±25 [V] of the voltage at the charge neutralization point. This allows the residual charge amount of the electrostatic chuck 22 to be less than 1 [%] of the wafer charge amount when the wafer W is actually attracted. In the dechuck step of FIG. 7, the HV voltage may be gradually controlled to reach the voltage at the charge neutralization point P.

As illustrated in FIG. 8, in the execution cycle of processing the wafer W in the substrate processing apparatus 1, first, the wafer W is loaded into the substrate processing apparatus 1 (step S1). Next, the HV voltage is applied from the power supply 36 to the attracting electrode 23 so that the wafer W is attracted to the electrostatic chuck 22 electrostatically (step S2). Then, the first and second radio frequency electric power are applied to the stage 20, to form a process gas supplied from the gas supply source 50 into a plasma, and plasma processing (treatment) such as etching is applied to the wafer W (step S3).

Next, in step S4, magnitude of the HV voltage in which the wafer W reaches the charge neutralization point is calculated. Specifically, the pusher pins 90 are moved up and down to joggle (vibrate) the wafer W, and current (induced current) $i_3(t)$, which flows from/into the attracting electrode 23 when the wafer W is joggled, is measured. Based on the induced current $i_3(t)$, a residual charge amount Q of the wafer W is calculated, and the HV voltage in which the wafer W reaches the charge neutralization point is calculated from the residual charge amount Q. Hereinafter, the HV voltage that is required to transit the state of the wafer W to the charge neutralization point may also be referred to as "target HV voltage". The timing of measuring the current (induced current) $i_3(t)$ may be a period after completion of the plasma processing of the wafer W and before performing the discharge step.

In the present embodiment, when the pusher pins 90 are lifted after the wafer processing, magnitude of force generated from the pin driver 82 that is required to lift the pusher pins 90 is measured, and the measured value is recorded. In the following description, the magnitude of force generated from the pin driver 82 that is required to lift the pusher pins 90 may also be referred to as "pin driving force". If the measured value of the pin driving force after the previous wafer processing is equal to or less than a predetermined threshold (hereinafter referred to as a "first threshold value $T_{th1}$"), a conventional discharging step is executed (step S5). Meanwhile, if the measured value of the pin driving force is greater than the first threshold value $T_{th1}$, it is determined that the wafer W may be damaged if the conventional discharging step is performed. In this case, the discharge and dechuck step according to the present embodiment is executed (step S6).

In step S5 (conventional discharging step), the HV voltage is turned off, and electrostatic attraction of the electrostatic chuck 22 for the wafer W is released. During the conventional discharging step, HV voltage whose magnitude is the same as the HV voltage applied during the plasma processing of the wafer W and whose polarity is reversed may be applied while an inert gas is supplied into the processing chamber 10. Details of step S6 (e.g. discharge and dechuck step according to the present embodiment) will be described below with reference to FIG. 9.

After step S5, the pusher pins 90 are lifted to dechuck the wafer W (step S7). At this time, the pin driving force is measured, as described above. The controller 100 acquires the measured pin driving force, and uses the measured pin driving force to determine which of step S5 and step S6 is to be executed after the next plasma processing. Next, the wafer W is unloaded (step S8) and the next wafer W is loaded (step S1).

Next, details of step S6 in FIG. 8 will be described in further detail with reference to FIG. 9. A process illustrated in FIG. 9 is mainly controlled by the controller 100.

<Discharging Method (Discharge and Dechuck Step>

Figure 9:
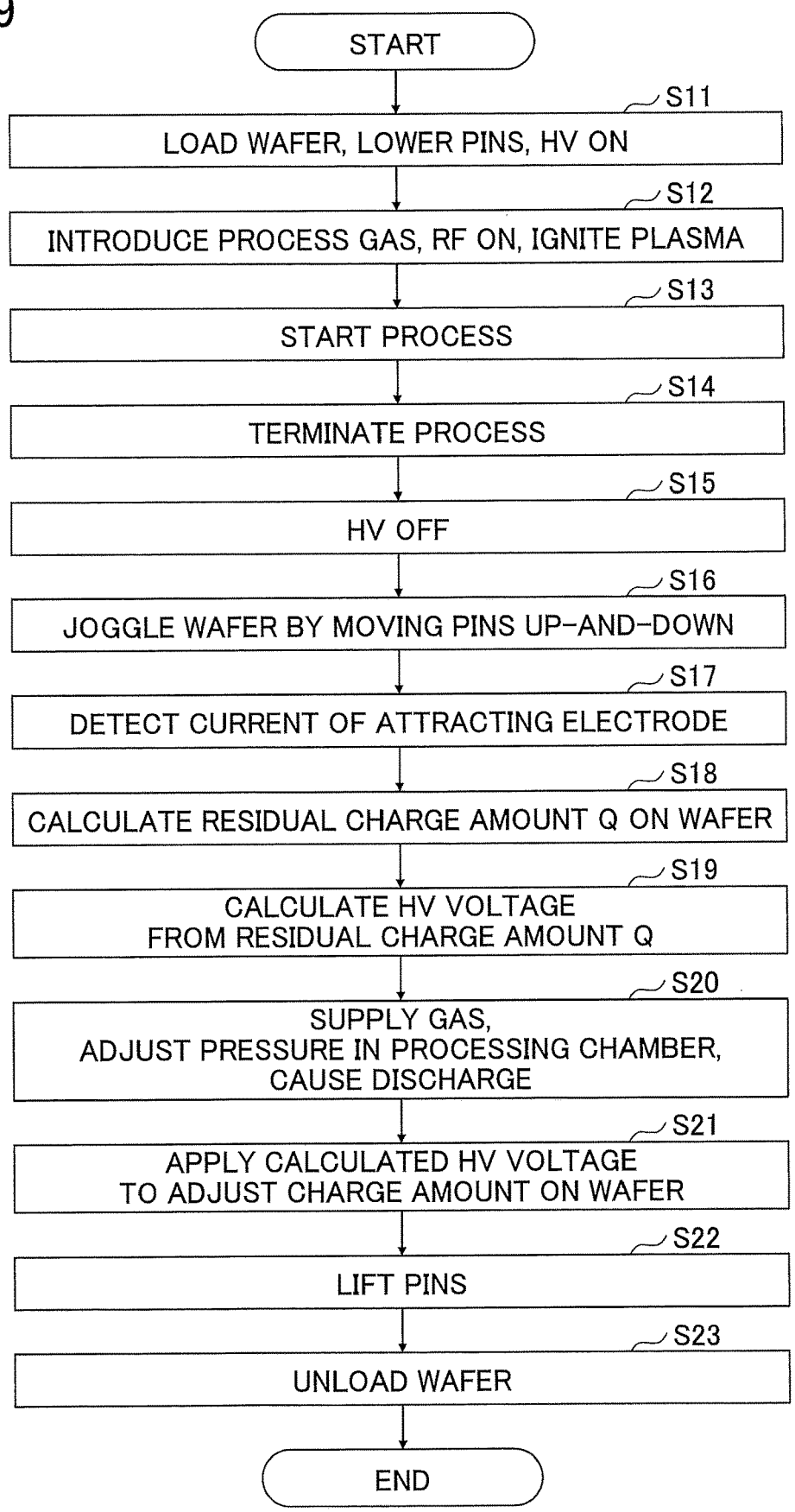
FIG. 9 is a flowchart illustrating an example of wafer processing including the discharge and dechuck step according to the embodiment.

FIG. 9 is a flowchart illustrating an example of a process for processing a wafer, which includes the discharging method (discharge and dechuck step) according to the present embodiment. The present process is controlled by the CPU 105 of the controller 100. FIG. 9 describes details of the process illustrated in FIG. 8 in a case in which the pin driving force is greater than the first threshold value $T_{th1}$. Step S11 in FIG. 9 corresponds to steps S1 and S2 in FIG. 8. Steps S12 to S14 in FIG. 9 correspond to step S3 in FIG. 8. Steps S15 to S19 in FIG. 9 correspond to step S4 in FIG. 8. Steps S20 to S22 in FIG. 9 correspond to step S6 in FIG. 8. Step S23 in FIG. 9 corresponds to step S8 in FIG. 8. However, in another embodiment, the process of FIG. 9 may be applied to all wafers W at the time of discharging and dechucking the wafers.

First, in step S11, the CPU 105 loads the wafer W into the substrate processing apparatus 1. Next, the CPU 105 lowers the pusher pins 90, and causes the electrostatic chuck 22 to electrostatically attract the wafer W, by applying predetermined magnitude of HV voltage (HV ON) from the power supply 36 to the attracting electrode 23 (step S11). Next, the CPU 105 supplies a process gas from the gas supply source 50 into the processing chamber 10, and applies the first and second radio frequency electric power to the stage 20 (RF ON), to ignite a plasma by exciting the gas (step S12).

Next, the CPU 105 starts plasma processing such as etching to the wafer W (step S13). After predetermined plasma treatment is completed, the CPU 105 terminates the plasma process (step S14). Then, in step S15, the CPU 105 stops applying DC voltage (HV OFF) to the attracting electrode 23.

Next, the CPU 105 moves the pusher pins 90 up and down by approximately 0.5 mm, to joggle the wafer W (step S16). As a result, induced current $i_3(t)$ occurs in the attracting electrode. The induced current $i_3(t)$ is input to the phase sensitive detector 80, and the phase sensitive detector 80 outputs an amplitude (DC component) of the induced current $i_3(t)$ in response to the input of the induced current $i_3(t)$ (step S17). In the present embodiment, the amplitude of the induced current $i_3(t)$ is denoted by "$I_3$".

Next, in step S18, the CPU 105 calculates the residual charge amount Q of the wafer W from the amplitude $I_3$ of the induced current $i_3(t)$ using the equation (17), which will be described below. Next, based on the calculated residual charge amount Q, the CPU 105 calculates the target HV voltage, which is magnitude of the HV voltage required to transit the state of the wafer W to the charge neutralization point for reaching the charge neutralization point (step S19).

Next, the CPU 105 adjusts the pressure in the processing chamber 10 to a predetermined pressure, e.g., in a range of 200 mTorr to 800 mTorr, by supplying a predetermined gas into the processing chamber 10, and the CPU 105 causes discharge in the processing chamber 10 by applying voltage (HV voltage) from the power supply 36 to the attracting electrode 23 (step S20). In applying voltage (HV voltage) to the attracting electrode 23, if the residual charge amount Q is negative, positive voltage may be applied as the HV voltage. Incidentally, the HV voltage may be applied by gradually increasing magnitude of the HV voltage in the positive direction, until the magnitude reaches a positive discharging start voltage. In contrast, if the residual charge amount Q is positive, negative voltage may be applied as the HV voltage. Incidentally, the HV voltage may be applied by gradually decreasing magnitude of the HV voltage in the negative direction until the magnitude reaches a negative discharging start voltage. Subsequently, the CPU 105 applies the target HV voltage reaching the charge neutralization region to the attracting electrode 23, to adjust the wafer charge amount (step S21). Note that, in a case in which the residual charge amount Q is negative, the HV voltage may be gradually increased in the positive direction until the target HV voltage is reached. Alternatively, in a case in which the residual charge amount Q is positive, the HV voltage may be gradually decreased in the negative direction until the target HV voltage is reached. By controlling the HV voltage, the wafer W can reach the charge neutralization point P at which the residual charge on the wafer W is canceled.

Next, the CPU 105 lifts the pusher pins 90 to remove the wafer W from the electrostatic chuck 22 (step S22). Finally, the CPU 105 unloads the wafer W from the processing chamber 10 (step S23), and the process terminates.

As described above, in the discharging method including the dechuck step according to the present embodiment, by controlling the HV voltage in the charge neutralization region in which the charge amount on the wafer W becomes zero or becomes in a neighborhood of zero, the residual charge amount of the electrostatic chuck 22 can be canceled and the wafer W can be dechucked without damage.

<Method for Measuring Residual Charge Amount Q>

Figure 10:
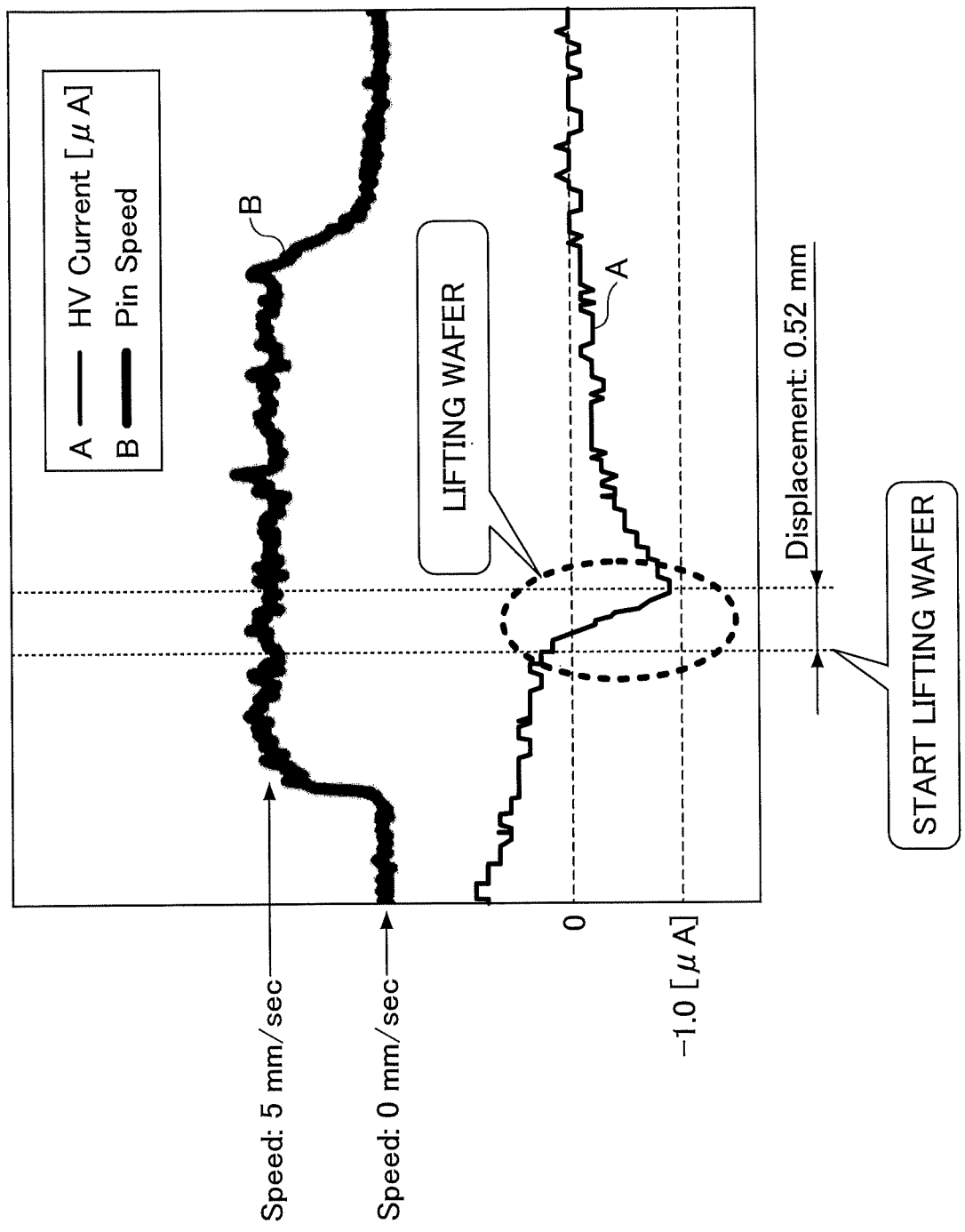
FIG. 10 is a diagram illustrating an example of current generated by displacement of the wafer.
Figures 11A, 11B:
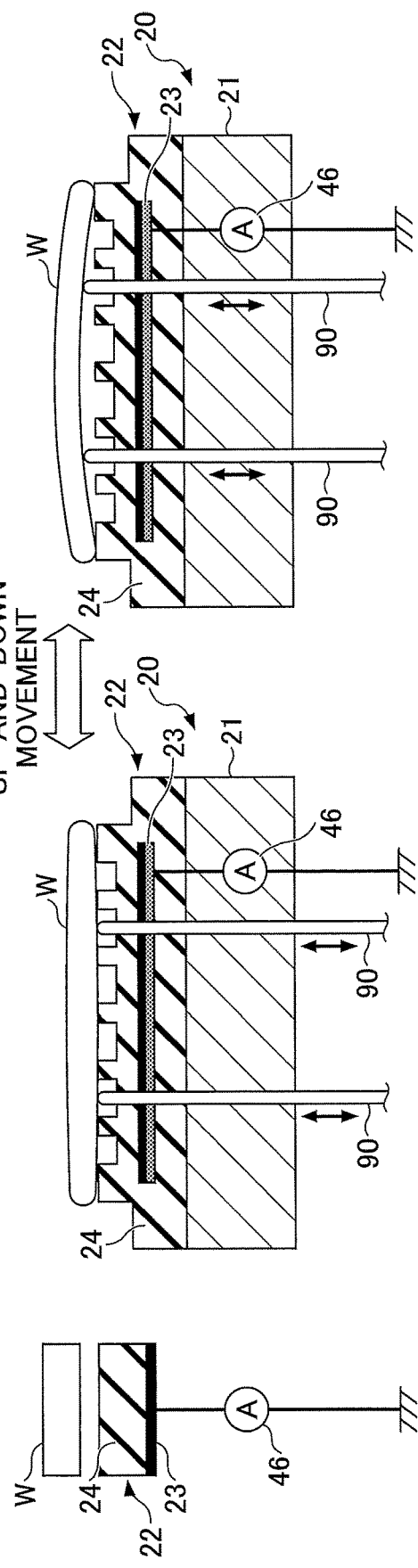
FIG. 11A is a diagram illustrating an example of an equivalent circuit of a structure between the lower electrode and the upper electrode according to the embodiment.
FIG. 11B is a diagram illustrating an example of a model of the substrate processing apparatus.

Finally, an example of a method for measuring the residual charge amount Q will be described with reference to FIGS. 10 and 11. FIG. 10 is a diagram illustrating an example of induced current generated by movement of a wafer according to the present embodiment. FIG. 11A is a diagram illustrating an example of an equivalent circuit of a structure between the lower electrode and the upper electrode according to the present embodiment. FIG. 11B is a diagram illustrating an example of a model of the substrate processing apparatus 1 that is used for calculating the residual charge amount Q according to the present embodiment.

When a wafer W is unloaded after plasma processing of the wafer W, the wafer W retains electric charge due to the influence of residual charge on the surface of the electrostatic chuck 22. In the present embodiment, the pusher pins 90 are moved up and down in this state. A signal for moving the pusher pins 90 up and down (hereinafter referred to as "reference signal") is controlled by the controller 100, and is input to the pin driver 82. The pin driver 82 actuates the pusher pins 90 in response to an input of the reference signal. By the actuation of the pin driver 82, the pusher pins 90 are vibrated in a vertical direction.

As will be described below, an amplitude of the vibration of the pusher pins 90 may be 1 mm or less, and more preferably 0.5 mm or less. Because the pusher pins 90 are vibrated in accordance with the reference signal as described above, the amplitude of the vibration of the pusher pins 90 may also be referred to as an "amplitude of the reference signal" in the present disclosure. It is preferable that a frequency of the vibration of the pusher pins 90 (may also be referred to as "a frequency of the reference signal") is greater than or equal to 1 Hz and smaller than or equal to 10 Hz.

When the pusher pins 90 are moved and the wafer W is displaced, induced current flows. In FIG. 10, the curve B indicates speed of movement of the pusher pins 90, and the curve A indicates the induced current flowing in response to the movement of the pusher pins 90. When the speed of the pusher pins 90 changes from 0 mm/sec to 5 mm/sec, and the pusher pins 90 start to lift the wafer W, induced current starts to flow in accordance with the displacement of the wafer W, resulting in the flow of the induced current of approximately −1.0 [μA] at the maximum. Whether the polarity of the induced current is negative or positive depends on the polarity of electric charge accumulated on the wafer W.

The induced current occurs in all the electrodes facing the wafer W. That is, the induced current occurs in the attracting electrode 23, the upper electrode, and the inner wall of the processing chamber 10. FIG. 10 illustrates a measured result of the induced current having occurred in the attracting electrode 23. In the present embodiment, an ammeter 46, which is connected to the attracting electrode 23, is provided, and the induced current occurring in the attracting electrode 23 is measured by the ammeter 46.

In the example of FIG. 10, a distance of movement of the pusher pins 90 is approximately 0.5 mm. That is, the wafer W is displaced by approximately 0.5 mm, by the vertical vibration of the pusher pins 90. The left side of the model illustrated in FIG. 11B represents a state in which the wafer W is placed on the stage 20, and the right side of the model in FIG. 11B represents a state in which the wafer W is lifted slightly by the pusher pins 90 from the stage 20 by approximately 0.5 mm. The wafer W does not fully leave the electrostatic chuck 22. The wafer W is slightly lifted by the pusher pins 90, while a part of the wafer W is being attracted to the electrostatic chuck 22 because of residual attracting force.

<Phase Sensitive Detection>

Induced current and leak current have a 90-degree displacement with each other. The phase sensitive detector 80 outputs an amplitude (DC component) of the induced current separately from the leak current. Measuring electric potentials of metal electrodes by use of the Kelvin method is directed to a system, in which both electrodes are directly connected to a power supply, as in a case of a capacitor. On the other hand, in the substrate processing apparatus 1 according to the present embodiment, because the wafer W is a floating electrode, the potential cannot be specified. Therefore, in the substrate processing apparatus 1 according to the present exemplary embodiment, an electric potential of the wafer W cannot be measured by the Kelvin method. Accordingly, in the present embodiment, capacitance C is calculated from a physical structure of the wafer W and the electrostatic chuck 22, and the potential V of the wafer W is calculated from the residual charge amount Q.

A description is made by referring to the equivalent circuit illustrated in FIG. 11A. The Kelvin method can be applied to a space between the upper electrode (gas showerhead 40) and the attracting electrode 23 including the wafer W and the base member 24, and can measure voltage between the two electrodes. However, the Kelvin method cannot measure the state of the wafer W.

In contrast, in the measurement method according to the present embodiment, the state of the wafer W can be directly measured. Cracking and bouncing of the wafer W are attributable to the residual attracting force of the wafer W caused by a change in a surface condition of the electrostatic chuck 22. In order to prevent cracking and bouncing of the wafer W, the measurement method according to the present embodiment calculates the residual charge amount Q of the wafer W before dechucking the wafer from the electrostatic chuck 22, and calculates the target HV voltage from the calculated residual charge amount Q.

In the present embodiment, the residual charge amount Q is calculated from the DC component (amplitude) of the induced current that is detected by the phase sensitive detector 80, and the target HV voltage is calculated from the calculated residual charge amount Q. Then, the target HV voltage is applied during the dechuck step, so that the wafer can be detached from the electrostatic chuck 22 without occurrence of cracking and bouncing of the wafer W.

<Measurement Method of Residual Charge>

Next, a method for calculating the residual charge amount Q will be described. When the wafer W has electric charge, if the wafer W is moved, induced current flows from/to the upper electrode and the attracting electrode 23. The induced current flowing from/to the attracting electrode 23 is determined by the amount of charge on the wafer and the capacitance between the wafer and the ground potential. The capacitance between the wafer and the ground potential is determined by the structure of the electrostatic chuck 22 and the structure of the processing chamber 10. Thus, once the structure of the electrostatic chuck 22 and the structure of the processing chamber 10 are determined, the capacitance between the wafer W and the ground potential can be obtained by calculation.

In the model of FIG. 11A, when the wafer W is moved, induced current occurs in the attracting electrode 23. The amount of current flowing from (or flowing into) the attracting electrode 23 is measured by the ammeter 46. In the following, an expression for calculating the residual charge amount Q of the wafer W from the induced current $i_3(t)$ of the attracting electrode 23 will be derived. In each expression appearing in the following description, a variable having suffix "1" represents a variable relating to the upper electrode, a variable having suffix "2" represents a variable relating to the wafer, and a variable having suffix "3" represents a variable relating to the electrostatic chuck.

First, when the vertical movement of the wafer W is described as a function of time, a distance $h_2(t)$ by which the wafer W is lifted by the pusher pins 90 (hereinafter referred to as a "lifting distance of the wafer W") is calculated by the following equation (1).

$$h_2(t)=A_0+A_1 \sin(\omega t-\varphi) \qquad (1)$$

where $A_1$ is an amplitude of the pusher pins 90 when the pusher pins 90 are joggled, $A_0$ is the offset of the amplitude of the reference signal (the center of the oscillation of the wafer W), and $\omega$ is the angular frequency.

A distance $h_1(t)$ between the wafer W and the upper electrode is calculated by the following equation (2).

$$h_1(t)=H_{gap}-H_{wafer}-h_2(t)=B_0-A_0-A_1 \sin(\omega t-\varphi) \qquad (2)$$

where $H_{gap}$ is a distance between a surface of the upper electrode and a surface of the electrostatic chuck, and $H_{wafer}$ is the thickness of the wafer. In the equation (2), $(H_{gap}-H_{wafer})$ is denoted by $B_0$.

If the residual charge amount Q on the wafer is not discharged, the amount of charge remains constant. Thus, the residual charge amount Q on the wafer is expressed by the following equation (3).

$$Q=c(t)\times v(t)=\text{const.} \qquad (3)$$

where c(t) is capacitance between the wafer and the ground, and v(t) is voltage between the wafer and the ground.

Because only the wafer W retains electric charge, the voltage v(t) between the wafer and the ground is calculated by the following equation (4).

$$v(t)=v_1(t)=v_3(t) \qquad (4)$$

where $v_1(t)$ is voltage between the wafer and the upper electrode, and $v_3(t)$ is voltage between the wafer and the attracting electrode.

The residual charge amount Q on the wafer W is a sum of an amount of charge $q_1(t)$ induced on the upper electrode and an amount of charge $q_3(t)$ induced on the attracting electrode. This relationship is expressed by the following equation (5).

$$Q=q_1(t)+q_3(t)=q_2(t) \qquad (5)$$

where $q_2(t)$ indicates an amount of charge on the wafer.

The capacitance c(t) between the wafer and the ground is calculated by the following equation (6).

$$c(t)=(c_1(t)\times c_2(t)+c_2(t)\times C_3+C_3\times c_1(t))/(c_2(t)+C_3) \qquad (6)$$

where $c_1(t)$ is the capacitance between the wafer and the upper electrode, $c_2(t)$ is the capacitance between the wafer and the surface of the electrostatic chuck, and $C_3$ is the capacitance of a gap filled with a dielectric layer between the surface of the electrostatic chuck and the attracting electrode.

Voltage v(t) between the wafer and the ground is calculated by the following equation (7). The equation (7) is derived from the equations (3) and (6).

$$v(t)=Q/c(t)=(c_2(t)+C_3)\times Q/(c_1(t)\times c_2(t)+c_2(t)\times C_3+C_3\times c_1(t)) \qquad (7)$$

Further, from the equations (5) and (7), the following equation (8) is derived.

$$Q=q_1(t)+q_3(t)=v(t)\times(c_1(t)\times c_2(t)+c_2(t)\times C_3+C_3\times c_1(t))/(c_2(t)+C_3) \qquad (8)$$

The capacitance between each of the members (upper electrode, lower electrode, wafer) is expressed by the following equations (9) to (13).

$$c_1(t)=\varepsilon_0 \times S_{wafer}/h_1(t) \quad (9)$$

where $\varepsilon_0$ is vacuum permittivity, and $S_{wafer}$ is an area of the surface of the wafer. Also, as noted above, $h_1(t)$ represents the distance between the wafer W and the upper electrode.

$$c_2(t)=\varepsilon_0 \times S_{wafer}/h_2(t) \quad (10)$$

where $h_2(t)$ is, as noted above, the lifting distance of the wafer W, which corresponds to a distance between the wafer W and the surface of the electrostatic chuck.

$$C_3=\varepsilon_{ESC} \times \varepsilon_0 \times S_{wafer}/h_{ESC} \quad (11)$$

where $\varepsilon_{ESC}$ is a relative permittivity of material of the electrostatic chuck, and $h_{ESC}$ is a distance between the surface of the electrostatic chuck and the attracting electrode.

$$c_{23}(t)=\varepsilon_{ESC} \times \varepsilon_0 \times S_{wafer}/(\varepsilon_{ESC} \times h_2(t)+h_{ESC}) \quad (12)$$

where $c_{23}(t)$ is the capacitance of a gap between the wafer and the attracting electrode, and $h_2(t)$ is the lifting distance of the wafer, as described above.

$$c(t)=\varepsilon_0 \times S_{wafer}/h_1(t)+\varepsilon_{ESC} \times \varepsilon_0 \times S_{wafer}/(\varepsilon_{ESC} \times h_2(t)+h_{ESC}) \quad (13)$$

where $c(t)$ is the capacitance between the wafer and ground.

By using the equations (2), (7), and (9) to (11), the equation (8) is modified into the following equation (14), which provides the amount of charge $q_3(t)$ induced on the attracting electrode.

$$q_3(t)=v(t) \times (c_1(t) \times c_2(t)+c_2(t) \times C_3+C_3 \times c_1(t))/(c_2(t)+C_3)-q_1(t)$$

$$=v(t) \times c_2(t) \times C_3/(c_2(t)+C_3)$$

$$=c_2(t) \times C_3 \times Q/(c_1(t) \times c_2(t)+c_2(t) \times C_3+C_3 \times c_1(t))$$

$$=Q \times h_1(t)/(\varepsilon_0 \times S_{wafer}/C_3+h_1(t)+h_2(t))$$

$$=Q \times h_1(t)/(h_{ESC}/\varepsilon_{ESC}+h_1(t)+h_2(t))$$

$$=Q \times (B_0-A_0-A_1 \sin(\omega t-\varphi))/(h_{ESC}/\varepsilon_{ESC}+B_0)$$

$$=Q \times (B_0-A_0)/(h_{ESC}/\varepsilon_{ESC}+B_0)-Q \times A_1 \sin(\omega t-\varphi)/(h_{ESC}/\varepsilon_{ESC}+B_0)$$

$$=Q_0-A \sin(\omega t-\varphi) \quad (14)$$

where $Q_0=Q \times (B_0-A_0)/(h_{ESC}/\varepsilon_{ESC}+B_0)$, and $$A=Q \times A_1/(h_{ESC}/\varepsilon_{ESC}+B_0).$$

By differentiating the equation (14) with respect to time, the induced current $i_3(t)$ of the attracting electrode can be calculated.

$$i_3(t) = \frac{dq_3(t)}{dt} = \frac{d}{dt}(Q_0 - A\sin(\omega t - \varphi)) = -A\omega\cos(\omega t - \varphi) \quad (15)$$

As a result, the amplitude (DC component) $I_3$ of the induced current $i_3(t)$ is calculated by the following equation (16).

$$I_3=A \times \omega=Q \times A_1 \times \omega/(h_{ESC}/\varepsilon_{ESC}+B_0) \quad (16)$$

When the induced current $i_3(t)$ of the attracting electrode is input to the phase sensitive detector 80, the phase sensitive detector 80 outputs the amplitude $I_3$ of the induced current $i_3(t)$. The controller 100 acquires the amplitude $I_3$ from the phase sensitive detector 80, and calculates the residual charge amount Q of the wafer W using the amplitude $I_3$ in accordance with the following equation (17).

$$Q=[(h_{ESC}/\varepsilon_{ESC}+B_0)/(A_1 \times \omega)] \times I_3 \quad (17)$$

The residual charge amount Q can be calculated according to the above-described method.

However, the method of calculating the residual charge amount Q is not limited thereto, and other methods may be used. Alternatively, during the dechuck step, the CPU 105 may determine whether the HV voltage is to be controlled in a positive direction or a negative direction by trial and error, without computing the residual charge amount Q.

For example, the wafer charge amount may be monitored to estimate a relationship between the control direction (positive direction or negative direction) of the HV voltage and change in the monitored value, and whether the HV voltage to be controlled in the positive direction or the negative direction may be determined based on the relationship. Furthermore, the HV voltage may be controlled by trial and error in the following manner. If the pin driving force continues to increase when the HV voltage is controlled in the positive direction, the HV voltage may be decreased in the negative direction.

Note that an ammeter 44 illustrated in FIG. 2B may not be provided. However, in a case in which the ammeter 44 is connected between the upper electrode and the ground, the capacitance $C_1$ of the electrostatic chuck 22 can be measured more accurately from a slope of measured values of the ammeter 44, because the slope of the measured values corresponds to the capacitance $C_1$. Although it is rare that the capacitance $C_1$ varies while executing the discharging method including the dechuck step according to the present embodiment, if such a case in which the capacitance $C_1$ varies has occurred, accurate capacitance $C_1$ can be obtained from the measured values of the ammeter 44. By measuring the capacitance $C_1$ more accurately, the residual charge amount Q can be calculated more accurately.

As described above, according to the discharging method and the substrate processing apparatus 1 of the present embodiment, residual charge on the wafer can be sufficiently removed.

The discharging method and the substrate processing apparatus according to the embodiment disclosed herein should be considered exemplary in all respects and not limiting. The above embodiments may be modified and enhanced in various forms without departing from the appended claims and the gist thereof. Matters described in the above embodiments may take other configurations to an extent not inconsistent, and may be combined to an extent not inconsistent.

For example, in the above-described embodiment, in order to adjust the wafer charge amount, discharge is caused by applying HV voltage (DC voltage). However, adjustment of the wafer charge amount may be performed using plasma discharge, by applying radio frequency electric power to excite gas and by causing the plasma discharge.

The substrate processing apparatus according to the present disclosure is applicable to any type of substrate processing apparatus, including an atomic layer deposition (ALD) apparatus, a capacitively coupled plasma (CCP) type processing apparatus, an inductively coupled plasma (ICP) type processing apparatus, a processing apparatus using a radial line slot antenna (RLSA), an electron cyclotron resonance plasma (ECR) type processing apparatus, and a helicon wave plasma (HWP) type processing apparatus.

Although a plasma processing apparatus has been described as an example of the substrate processing apparatus, the substrate processing apparatus may be an apparatus for applying a predetermined process (such as a deposition process and an etching process) to a substrate, and is not limited to a plasma processing apparatus.

What is claimed is:

1. A method of neutralizing a substrate, comprising:
   (a) supplying a gas into a processing chamber while the substrate is placed on an electrostatic chuck provided in the processing chamber;
   (b) applying direct-current (DC) voltage to an electrode of the electrostatic chuck until discharge occurs in the processing chamber;
   (c) adjusting, after (b), the DC voltage to a magnitude in which an amount of charge on the substrate becomes zero or becomes in a neighborhood of zero;
   (d) removing the substrate from the electrostatic chuck, after (c);
   (e) calculating a residual amount of charge on the substrate; and
   (f) calculating the magnitude of the DC voltage to be applied at (c), based on the residual amount of charge calculated at (e), wherein (e) includes
   vibrating the substrate in a vertical direction by moving pusher pins up and down, thereby causing current to flow from or to the electrode;
   measuring magnitude of the current flowing from the electrode; and
   calculating the residual amount of charge based on the magnitude of the current.

2. The method according to claim 1, wherein
   the DC voltage is controlled in a positive direction in a case in which the calculated residual amount of charge is negative; and
   the DC voltage is controlled in a negative direction in a case in which the calculated residual amount of charge is positive.

3. The method according to claim 1, further comprising:
   (g) after processing of the substrate is completed, measuring magnitude of force required to lift the substrate from the electrostatic chuck using pusher pins; and
   (h) determining whether to perform (a) to (d) based on the magnitude of force measured in (g).

4. The method according to claim 1, wherein (c) includes
   monitoring the residual amount of charge to estimate a relationship between a control direction of the voltage and a change in the residual amount of charge; and
   determining the magnitude of the DC voltage based on the relationship.

5. The method according to claim 1, wherein the gas is an inert gas.

6. The method according to claim 1, wherein, in step (a), the gas is supplied such that a pressure in the processing chamber becomes a predetermined range between 200 mTorr and 800 mTorr.

7. A method of processing a substrate, comprising:
   placing the substrate on the electrostatic chuck in a processing chamber;
   applying first direct-current (DC) voltage to the electrode to hold the substrate to the electrostatic chuck;
   processing the substrate;
   stopping the applying of the first DC voltage to the electrode;
   neutralizing the substrate, including
   (a) supplying a gas into the processing chamber while the substrate is placed on the electrostatic chuck;
   (b) applying second DC voltage to the electrode until discharge occurs;
   (c) adjusting, after (b), the second DC voltage to a magnitude in which an amount of charge on the substrate becomes zero or becomes in a neighborhood of zero;
   (d) removing the substrate from the electrostatic chuck, after (c),
   (e) calculating a residual amount of charge on the substrate; and
   (f) calculating the magnitude of the DC voltage to be applied at (c), based on the residual amount of charge calculated at (e),
   wherein (e) includes
   vibrating the substrate in a vertical direction by moving pusher pins up and down, thereby causing current to flow from or to the electrode;
   measuring magnitude of the current flowing from the electrode; and
   calculating the residual amount of charge based on the magnitude of the current.

8. An apparatus for processing a substrate, comprising:
   a processing chamber;
   an electrostatic chuck provided in the processing chamber; and
   a controller configured to cause;
      (a) supplying gas into the processing chamber while the substrate is placed on the electrostatic chuck;
      (b) applying direct-current (DC) voltage to an electrode of the electrostatic chuck, until discharge occurs;
      (c) adjusting, after (b), the DC voltage to a magnitude in which an amount of charge on the substrate becomes zero or becomes in a neighborhood of zero;
      (d) removing the substrate from the electrostatic chuck, after (c);
      (e) calculating a residual amount of charge on the substrate; and
      (f) calculating the magnitude of the DC voltage to be applied at (c), based on the residual amount of charge calculated at (e),
   wherein the apparatus further comprises:
      pusher pins configured to lift the substrate; and
      a pin driver configured to move the pusher pins up and down; and
   wherein
      (e) includes
         (e1) inputting a reference signal to the pin driver
         (e2) moving the pusher pins up and down by using the pin driver to vibrate the substrate;
         (e3) measuring magnitude of current flowing from or to the electrode, the flowing of the current being caused by the substrate being vibrated; and
         (e4) calculating the residual amount of charge based on the magnitude of the current.

9. The apparatus according to claim 8, wherein an amplitude of the pusher pins is equal to or less than 1 mm in (e2).

10. The apparatus according to claim 8, wherein a frequency of the moving of the pusher pins is equal to or greater than 1 Hz, and equal to or less than 10 Hz in (e2).

11. The apparatus according to claim 8, wherein speed of the moving of the pusher pins changes from 0 mm/s to 5 mm/s in (e2).

12. The apparatus according to claim 8, further comprising an ammeter that is electrically connected to the electrode; wherein the current flowing from or to the electrode is measured by the ammeter.

* * * * *